United States Patent [19]
Spitalny

[11] Patent Number: 5,574,401
[45] Date of Patent: Nov. 12, 1996

[54] LARGE COMMON MODE INPUT RANGE CMOS AMPLIFIER

[75] Inventor: Paul A. Spitalny, Everett, Wash.

[73] Assignee: Analog Devices, Inc., Norwood, Mass.

[21] Appl. No.: 460,084

[22] Filed: Jun. 2, 1995

[51] Int. Cl.⁶ .................................................. H03F 3/45
[52] U.S. Cl. .......................................... 330/253; 330/261
[58] Field of Search ................................. 330/253, 254, 330/257, 258, 261

[56] References Cited

U.S. PATENT DOCUMENTS

| | | | |
|---|---|---|---|
| 4,554,515 | 11/1985 | Burson et al. | 330/261 |
| 4,797,631 | 1/1989 | Hsu et al. | 330/253 |
| 5,323,120 | 6/1994 | Ryat | 330/261 X |
| 5,371,474 | 12/1994 | Wassenaar et al. | 330/253 |
| 5,384,548 | 1/1995 | Sakurai et al. | 330/253 |

OTHER PUBLICATIONS

"A Rail–to–Rail CMOS Op Amp", J. N. Babanezhad, IEEE Journal of Solid State Circuits, Dec. 1988, vol. 23, No. 6 pp. 1414–1417.

"A Compact Power–Efficient 3V CMOS Rail–to–Rail Input/Output Operational Amplifier for VLSI Cell Libraries", R. Hogervorst et al, IEEE Journal of Solid State Circuits, Dec. 1994, vol. 29, No. 12 pp. 1505–1513.

"Biasing Circuit for High Input Swing Operational Amplifiers" J. F. Duque–Carillo et al, IEEE Journal of Solid State Circuits Feb. 1995, vol. 30, No. 2, pp. 156–159.

"Constant Transconductance CMOS Amplifier Input Stage With Rail–to–Rail Common Mode Input Range", K. Nagaraj, IEEE Transactions on Circuits and Systems–II: Analog and Digital Signal Processing, May 1995, vol. 42, No. 5 pp. 366–368.

*Primary Examiner*—Steven Mottola
*Attorney, Agent, or Firm*—Parmelee, Bollinger & Bramblett

[57] ABSTRACT

A CMOS amplifier input stage including an NMOS differential pair connected in parallel with a PMOS differential pair. Each pair is connected to a tail-current transistor of the same type, and the combined circuits are coupled between positive and negative supply rails. The gates of the tail-current transistors receive the amplifier input signal to provide adaptive biasing of the differential pairs, resulting in a total combined transconductance for both differential pairs which is at least approximately constant with changes in input signal level, thereby enlarging the available common-mode input signal range of the amplifier.

11 Claims, 5 Drawing Sheets

LARGE COMMON MODE INPUT RANGE CMOS AMPLIFIER

BACKGROUND OF THE INVENTION

1. Field of the Invention

This invention relates to amplifiers employing MOS transistors. More particularly, this invention relates to such amplifiers having a CMOS input stage providing wide bandwidth and capable of operation with a large common mode input range.

2. Description of the Prior Art

It is known to provide an amplifier input stage having NMOS and PMOS differential pairs connected in parallel to accommodate a wide common-mode input range, as described for example in the article by Pardoen and DeGrauwe "A Rail-to-Rail Input/Output CMOS Power Amplifier", published in the IEEE Journal of Solid State Circuits, April, 1990. FIG. 1 of this application was taken from that article. The circuit of FIG. 1 uses NMOS and PMOS differential pairs 10, 12 connected in parallel between the supply rails $V_{dd}$ and $V_{cc}$. The differential pairs 10, 12 are connected to respective current mirrors 14, 16 arranged to combine the output signals at an output line 18. A current source Ip establishes the total (combined) tail currents of both differential pairs.

With this prior art arrangement, the tail currents of each pair will vary linearly with the input voltage level, one current going up, the other down, as the common-mode voltage swings through its range. The sum of the transconductances of both pairs will vary with common-mode voltage so that bandwidth and noise will correspondingly vary with the input signal level, resulting in distortion and unwanted noise in the output signal, and restricting the range of common-node input level variations. The present invention is directed to circuit arrangements which minimize such undesirable properties.

SUMMARY OF THE INVENTION

In embodiments of the invention to be described hereinbelow in detail, an amplifier input stage comprises NMOS and PMOS differential pairs connected in parallel between supply rails. The tail currents of these differential pairs are controlled in such a way as to maintain a nearly constant effective total transconductance, i.e., the combined transconductances of both pairs remain at least approximately constant, as the common-mode input voltage swings through its operating range. This result is achieved by adaptively biasing the tail currents so that they are made responsive to the input signal level. In the preferred embodiment, the arrangement is such that the tail currents vary with the input signal level in accordance with a square law relationship. With such a relationship, the amplifier can function effectively over a large input-signal range, providing wide bandwidth with low distortion and noise.

Although square-law relationships have been employed before, the techniques of application have been different from that of the inventive arrangement described herein. For example, special square-law current sources have been proposed, but that is a complicated and costly way of producing the desired relationship compared to the simple circuit configuration of the present invention wherein FETS in series with the differential pairs have their gates driven by the input signal.

The invention is particularly useful in high-fidelity audio circuits, for example as part of a buffer amplifier for supplying an input signal to a switched-capacitor delta-sigma converter. The ability to provide a CMOS amplifier with a large input signal range is important, particularly because supply voltages are steadily being reduced for portable IC chip equipment operations, e.g., it is becoming common to operate with supply voltages of 3 volts and below.

Other objects, aspects and advantages of the invention will in part be pointed out in, and in part apparent from, the following detailed description of preferred embodiments of the invention, considered together with the accompanying drawings.

DETAILED DESCRIPTION OF PREFERRED EMBODIMENTS

Figure 1:
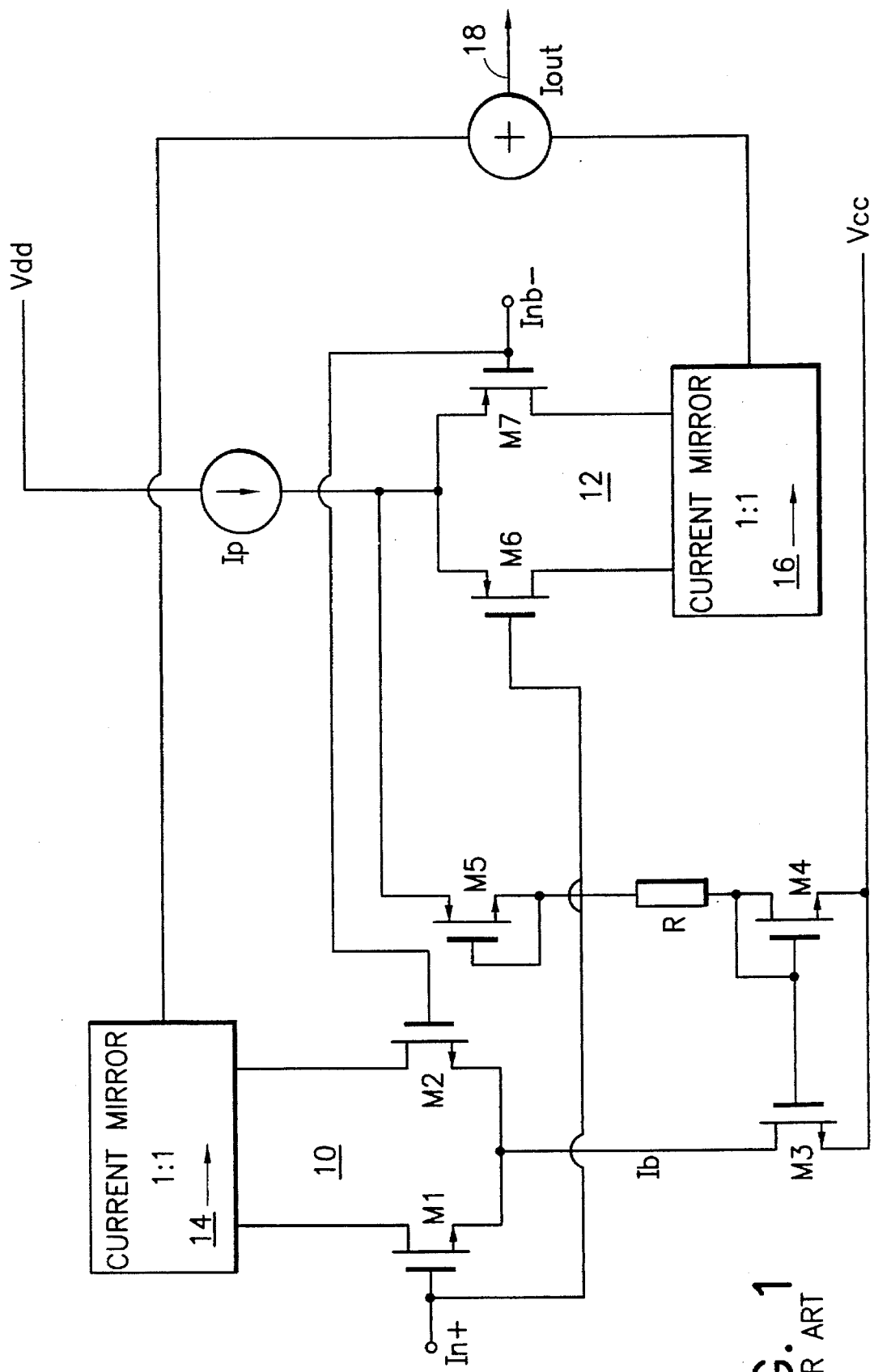
FIG. 1 is a circuit diagram, partly in block format, showing a prior art amplifier.
Figure 2:
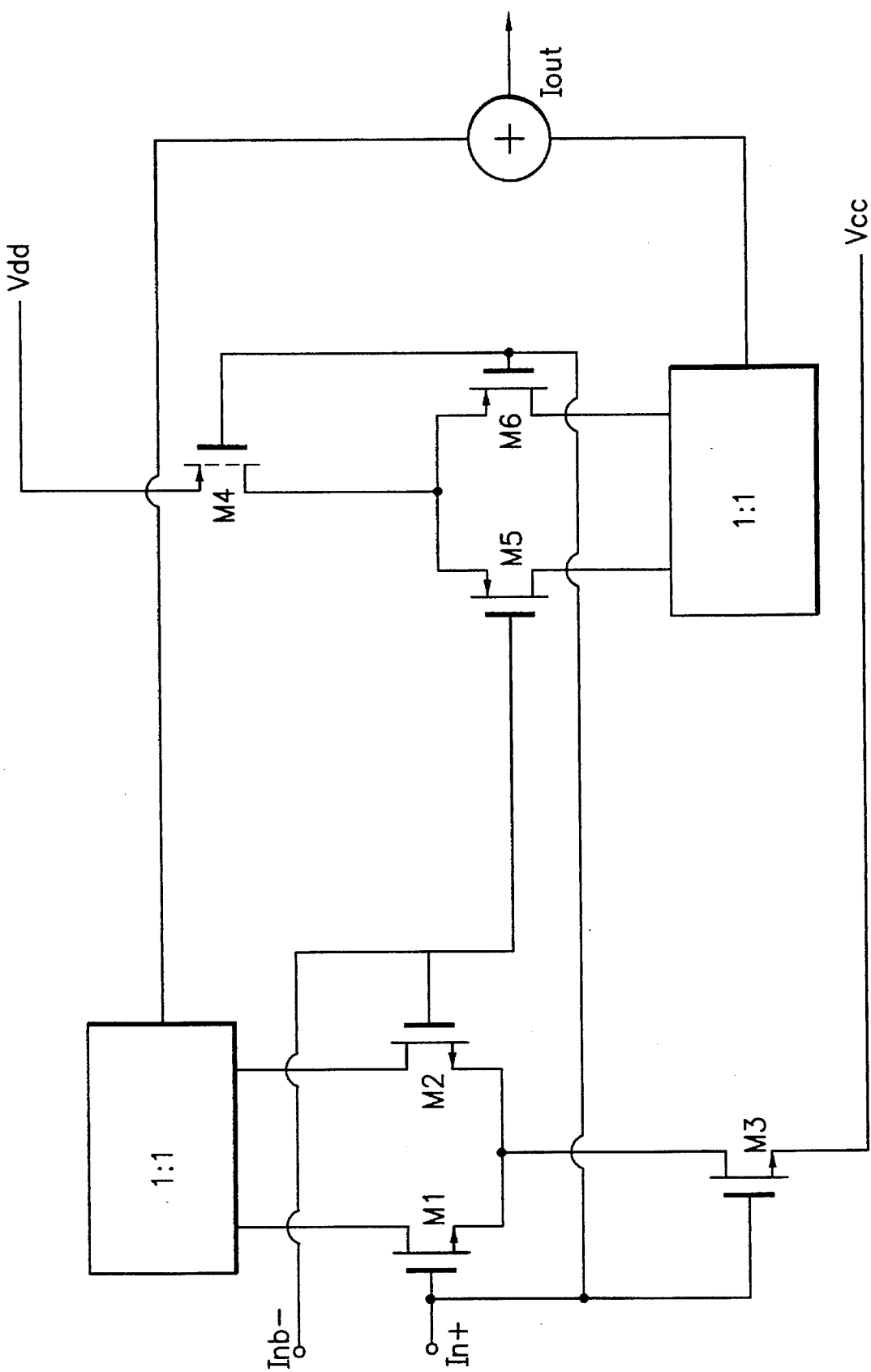
FIG. 2 shows a modification of FIG. 1 illustrating how the present invention can conceptually be developed.

Referring now to FIG. 2, the signal at input terminals 20, 22 is directed to the gates of NMOS and PMOS differential pairs 24, 26. In addition, the positive side of the input signal (terminal 20) is directed to the gates of NMOS and PMOS transistors 28, 30 which control the respective tail currents of the two differential pairs. These tail-current transistors act as variable resistors, rather than as high-impedance current sources.

As the input signal goes down, the resistance presented by the NMOS tail-current transistor 28 increases, while that of the other (PMOS) tail-current transistor 30 decreases. The resistances change smoothly with input signal, up until the point where the transistor resistance reaches the level where the corresponding differential pair is cut off.

It can be shown that with this input-adaptive biasing of the tail-current transistors 28, 30, the tail currents will be proportional to the square of the input voltage. Since the transconductance (gm) of an MOS transistor is proportional to the square-root of its drain current, the transconductances of the differential pairs 24, 26 will (at least approximately) be linearly related to the input signal level. As the transconductance of one pair goes up, the transconductance of the other pair will go down, in a matching fashion.

Thus, the total (combined) effective transconductance of the two differential pairs, as connected in parallel between the supply rails Vdd and Vcc, will be very nearly constant. This transconductance relationship is important because bandwidth is a function of transconductance and providing a constant transconductance makes it possible to optimize the bandwidth. Providing a combined transconductance which is constant with input signal level accommodates an enlarged common-mode voltage range while maintaining good bandwidth with low distortion and noise.

Figure 3:
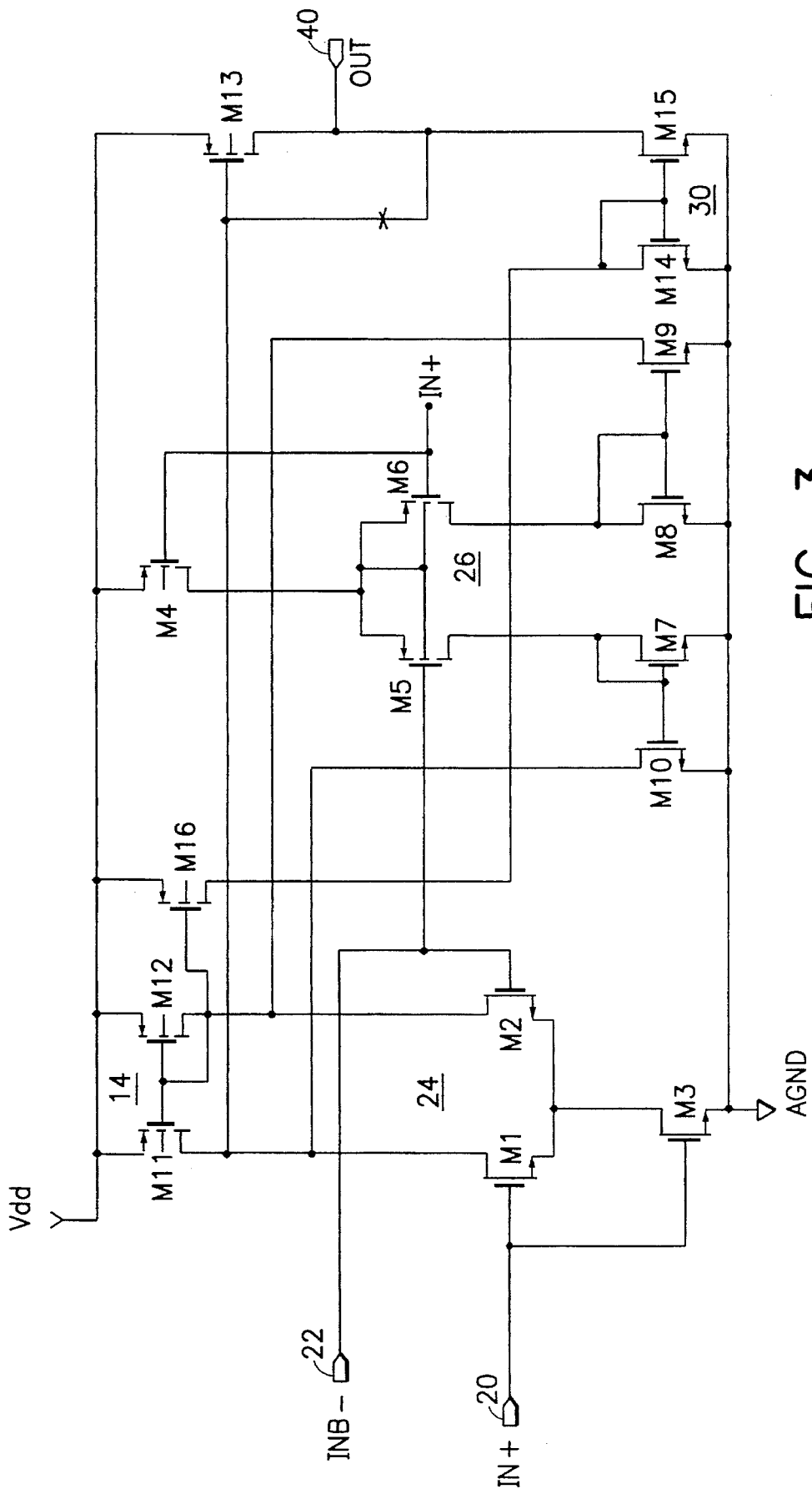
FIG. 3 shows a more complete circuit diagram of the amplifier of FIG. 2, showing features for implementing the invention for practical use.

FIG. 3 shows a more complete circuit based on the arrangement of FIG. 2. In FIG. 3, current mirrors are used to distribute the signals from the differential pairs 24, 26. More specifically, transistors M7, M8, and M9, M10 form current mirrors which serve to develop signals to combine the output currents of the PMOS differential pair 26 with the output currents of the NMOS differential pair 24. The output signal at the current mirror 14 (M11, M12) drives an output transistor M13 responsive to the combined signals, and that current mirror also drives a transistor M16 to mirror the current to another output transistor M15 through a current mirror 30. Serially-connected transistors M13 and M15 constitute a second stage of amplification, and produce the final output signal at the output terminal 40.

Figure 4:
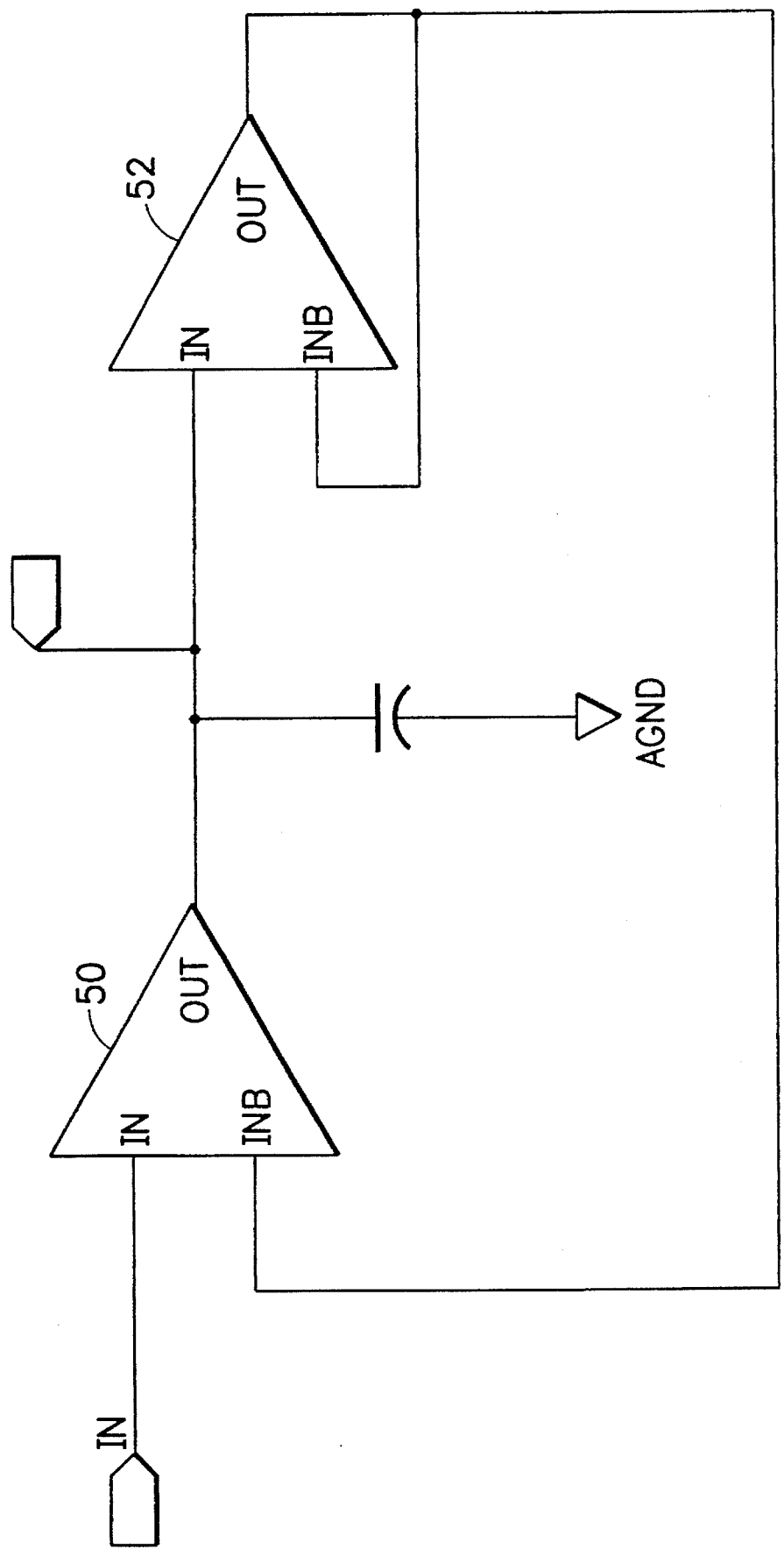
FIG. 4 shows in block diagram form an embodiment designed for use as part of an IC chip.
Figure 5:
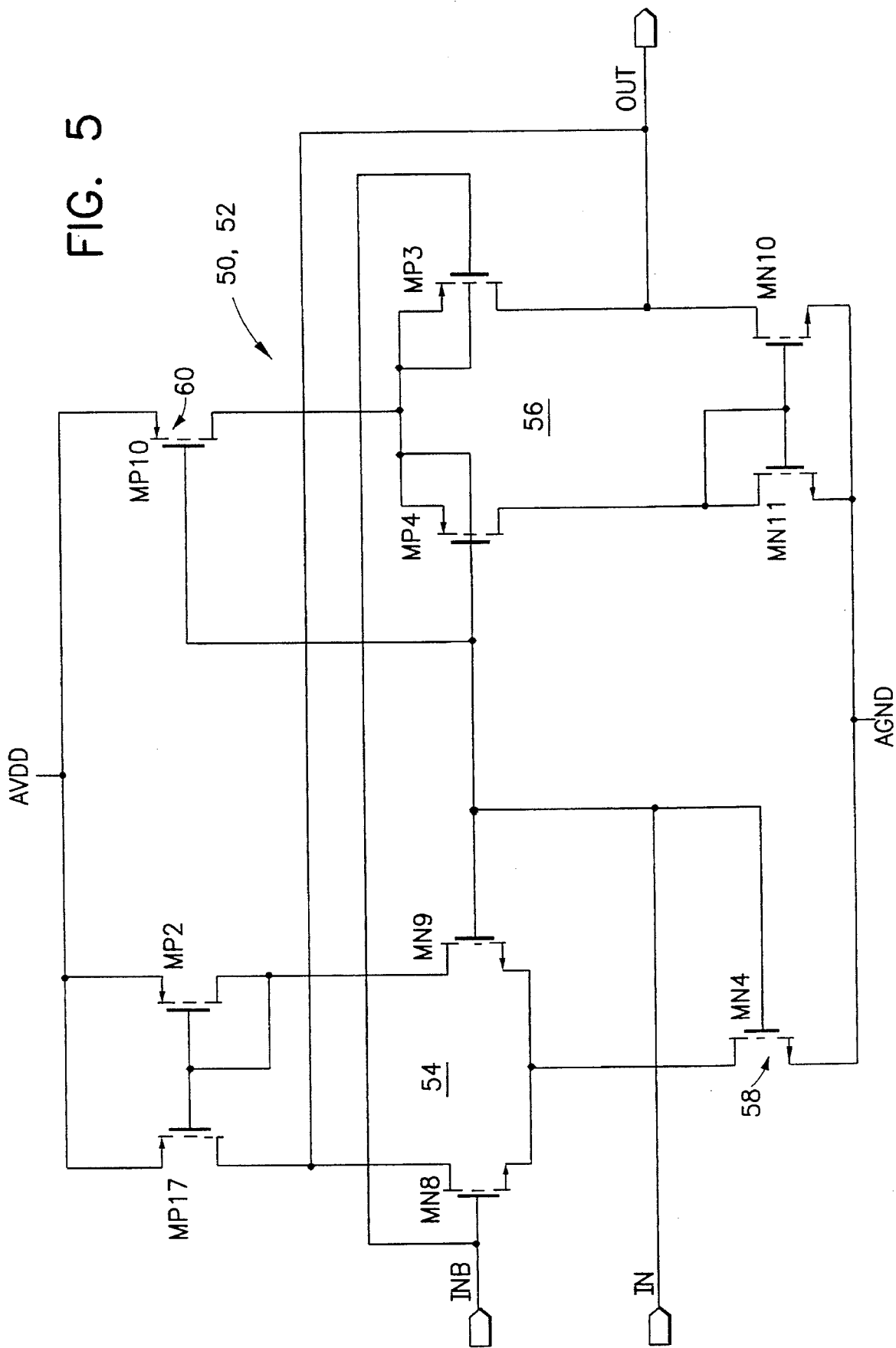
FIG. 5 shows circuit details of the amplifier blocks shown in FIG. 4.

FIG. 4 shows another embodiment wherein two separate but identical amplifiers 50, 52 in accordance with the invention are coupled together, with one amplifier 50 providing the forward gain and the other amplifier 52 providing negative feed-back. FIG. 5 shows details of the amplifiers 50, 52, with each including NMOS and PMOS differential pairs 54, 56, and tail current transistors 58, 60 with their gates driven by the input signal as in the other embodiments described above.

Although several embodiments of the invention have been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. An amplifier comprising:

a differential pair of NMOS transistors;

an NMOS transistor connected to said NMOS differential pair to conduct the tail current thereof;

a differential pair of PMOS transistors;

a PMOS transistor connected to said PMOS differential pair to conduct the tail current thereof;

means connecting said NMOS differential pair together with said tail current NMOS transistor between two supply rails;

means connecting said PMOS differential pair together with said tail current PMOS transistor between said supply rails;

first and second input terminals to provide an input signal to said NMOS and PMOS differential pairs;

means responsive to the input signal for controlling said tail-current NMOS and PMOS transistors to effect adaptive biasing of said transistors; and means to combine the outputs of said differential pairs to produce a composite output signal.

2. An amplifier as claimed in claim 1, wherein said input signal is directed to-the gates of said tail-current transistors.

3. An amplifier as claimed in claim 1, wherein said tail-current transistors operate as variable resistors in series with the corresponding differential pair.

4. An amplifier as claimed in claim 1, wherein each of the gates of said tail-current transistors is connected to an input terminal.

5. An amplifier as claimed in claim 4, wherein said gates are connected to the same input terminal.

6. In a CMOS amplifier having NMOS and PMOS differential pairs connected in parallel;

the method of extending the amplifier operating range comprising:

controlling the tail currents of both of said differential pairs in accordance with the square of variations in the input signal to said differential pairs; and combining the outputs of said differential pairs.

7. The method of claim 6, wherein said tail currents are controlled by passing them through MOS transistors the gates of which are supplied with signals derived from said input signal.

8. In a CMOS amplifier having NMOS and PMOS differential pairs connected in parallel between supply rails, the method of extending the amplifier input signal range comprising:

control means for controlling the tail currents of both of said differential pairs in a way to maintain an effectively constant transconductance of both differential pairs;

said control means comprising series variable impedance means through which said tail current flows;

said variable impedance means including a control electrode for varying the magnitude of impedance in accordance with the magnitude of voltage of said control electrode;

means for applying to said control electrode a control signal directly corresponding to the amplifier input signal; and combining the outputs of both differential pairs to form a composite output signal.

9. In a CMOS amplifier having NMOS and PMOS differential pairs connected in parallel between supply rails, the method of extending the amplifier input signal range comprising:

controlling the tail currents of said differential pairs in a way to maintain an effectively constant transconductance of both differential pairs by controling the tail currents so that they are made proportional to the square of the input signal level; and combining the outputs of both differential pairs to form a composite output signal.

10. An amplifier as in claim 8 wherein said variable impedance means comprises a transistor having a control electrode receiving said control signal.

11. An amplifier as in claim 10 wherein said transistor is an FET device.

* * * * *